(12) United States Patent
Constant et al.

(10) Patent No.: US 11,721,736 B2
(45) Date of Patent: Aug. 8, 2023

(54) ELECTRONIC DEVICE INCLUDING A GATE STRUCTURE AND A PROCESS OF FORMING THE SAME

(71) Applicant: SEMICONDUCTOR COMPONENTS INDUSTRIES, LLC, Phoenix, AZ (US)

(72) Inventors: Aurore Constant, Oudenaarde (BE); Joris Baele, Ghent (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 137 days.

(21) Appl. No.: 17/172,243

(22) Filed: Feb. 10, 2021

(65) Prior Publication Data

US 2022/0254894 A1    Aug. 11, 2022

(51) Int. Cl.
*H01L 29/423* (2006.01)
*H01L 29/66* (2006.01)
*H01L 29/778* (2006.01)

(52) U.S. Cl.
CPC .. *H01L 29/42376* (2013.01); *H01L 29/66545* (2013.01); *H01L 29/66553* (2013.01); *H01L 29/7783* (2013.01)

(58) Field of Classification Search
CPC ......... H01L 29/42376; H01L 29/66545; H01L 29/66553; H01L 29/7783; H01L 21/823437; H01L 21/823456; H01L 21/823828; H01L 21/823842; H01L 21/28008; H01L 29/49–4975
See application file for complete search history.

(56) References Cited

U.S. PATENT DOCUMENTS

| 5,480,820 A | 1/1996 | Roth et al. |
| 5,650,345 A | 7/1997 | Ogura et al. |
| (Continued) | | |

FOREIGN PATENT DOCUMENTS

EP    2667415 A1    11/2013

OTHER PUBLICATIONS

European Search Report for EP App. No. 22155852.1 (corresponding to U.S. Appl. No. 17/172,243); European Patent Office; pp. 1-11.

(Continued)

*Primary Examiner* — Monica D Harrison
*Assistant Examiner* — Andre C Stevenson
(74) *Attorney, Agent, or Firm* — Abel Schillinger, LLP

(57) ABSTRACT

An electronic device can include a gate structure. In an embodiment, the gate structure can include a gate electrode including a doped semiconductor material, a metal-containing member, a pair of conductive sidewall spacers. The first metal-containing member can overlie the gate electrode. The conductive sidewall spacers can overlie the gate electrode and along opposite sides of the first metal-containing member. In another embodiment, the gate structure can include a gate electrode, a first metal-containing member overlying the gate electrode, and a second metal-containing member overlying the first metal-containing member. The first metal-containing member can have a length that is greater than the length of the second metal-containing member and substantially the same length as the gate electrode.

17 Claims, 4 Drawing Sheets

(56) References Cited

U.S. PATENT DOCUMENTS

| | | | |
|---|---|---|---|
| 6,169,025 B1* | 1/2001 | Kuo | H01L 21/76897 |
| | | | 257/E21.507 |
| 7,638,433 B2* | 12/2009 | Yun | H01L 21/28097 |
| | | | 257/E21.624 |
| 10,741,494 B2 | 8/2020 | Constant et al. | |
| 2012/0175631 A1 | 7/2012 | Lidow et al. | |
| 2015/0228746 A1* | 8/2015 | Chiang | H01L 29/4966 |
| | | | 257/288 |

OTHER PUBLICATIONS

Kashim et al. Analytical Modeling of Channel Potential and Threshold Voltage of Triple Material Gate AlGaN/GaN HEMT Including Trapped and Polarization-induced Charges; wileyonlinelibrary.com/journal/jnm; John Wiley & Sons Ltd.; pp. 1-14(2018).

Sayadi et al.; "Threshold Voltage Instability in p-GaN Gate AlGaN/GaN HFETs"; IEEE Trans. on Electronic Dev.; 0018-9383; TED. 2018.2828702; pp. 1-7 (2018).

Greco et al.; "Metal/p-GaN Contacts on AlGaN/GaN Heterostructures for Normally-off HEMTs"; Material Science Forum; Trans Tech Publications, Switzerland; vol. 858; pp. 1170-1173 (2016).

Greco et al.; "Ohmic Contacts to Gallium Nitride Materials"; Applied Surface Science; dx.doi.org/10.1016/j.apsusc.2016.04.016; pp. 1-52 (2016).

Dadgour et al.; "Grain-Orientation Induced Work Function Variation in Nanoscale Metal-Gate Transistors—Part II: Implications for Process, Device, and Circuit Design"; IEEE Trans. on Electronic Dev.; vol. 57, No. 10; pp. 2515-2525 (2010).

\* cited by examiner

ELECTRONIC DEVICE INCLUDING A GATE STRUCTURE AND A PROCESS OF FORMING THE SAME

FIELD OF THE DISCLOSURE

The present disclosure relates to electronic devices and processes, and more particularly to, electronic devices that include gate structures and processes of forming such electronic devices.

RELATED ART

An enhancement-mode high electron mobility transistor can have p-type doped GaN as part of a gate structure. After forming the p-type doped GaN gate electrode, an interlevel dielectric layer can be formed over the gate electrode and patterned to define a contact opening to the gate electrode. During the patterning, the interlevel dielectric layer is etched to define the contact opening to expose the gate electrode, the exposed surface of the p-type doped GaN may become roughened. The roughened surface can cause higher gate current, which is undesired.

The type of contact between the p-type doped GaN electrode and the metallization for the contact may also affect gate current and the threshold voltage of the transistor. A Schottky contact can provide relatively low gate leakage current; however, it is accompanied by a relatively positive threshold voltage shift. Another contact may be characterized as being more of an ohmic contact. Such a contact can provide relatively negative threshold voltage shift; however, it can be accompanied by relatively high gate leakage current.

Further, a metalized contact can be formed within the contact opening of the interlevel dielectric layer. Such a process flow may result in significant parasitic gate leakage current along the sidewall of the p-type doped gate electrode.

Many times, skilled artisans have to choose between a negative threshold voltage shift and high gate leakage current, both of which are undesired. Improvements to allow a good combination of threshold voltage shift and acceptable gate leakage current is desired.

BRIEF DESCRIPTION OF THE DRAWINGS

Embodiments are illustrated by way of example and are not limited in the accompanying figures.

Figure 1:
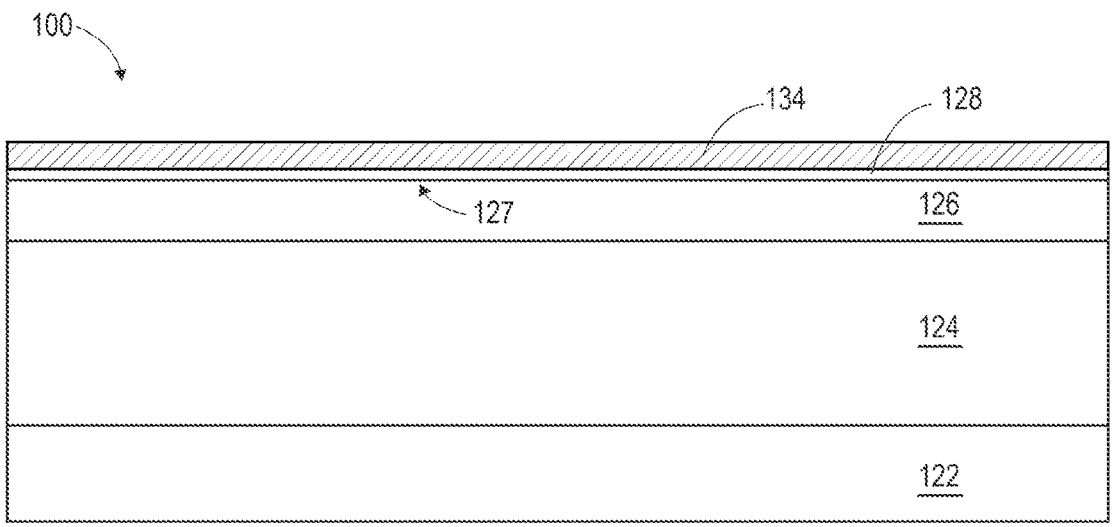
FIG. 1 includes an illustration of a cross-sectional view of a portion of a workpiece that includes a base material, a buffer layer, a channel layer, a barrier layer, and a gate electrode layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "alloy" is intended to mean a mixture of at least two different metal elements that is substantially free (less than 0.1 weight %) of an intermetallic compound.

The term "compound" is intended to mean a molecule that includes at least two different elements.

The term "conductive," with respect to a material, is intended to mean the material has a conductivity of at least $100\ \Omega^{-1}\mathrm{m}^{-1}$. Many metals, metal alloys, and metal nitrides are conductors. Insulating materials (e.g., $SiO_2$, $Si_3N_4$, $Al_2O_3$, etc.) and undoped semiconductor materials (e.g., Si, SiC, ZnO, etc.) are not conductive.

With respect directions, the term "lateral" and its variants refer to a direction or dimension along a primary surface of a workpiece or a plane along or parallel to the primary surface. The primary surface may correspond to a surface of a layer or a substrate within the workpiece. Two components may lie at different elevations and be separated by a distance in an x-axis, a y-axis or both the x- and y-axes, where the x- and y-axes are perpendicular to each other. Lateral dimensions do not consider vertical, or z-axis, offsets.

With respect dimensions, length is measured in a direction along or parallel to a direction corresponding to a principal current flow through a component, region, or layer, and width is measured in a direction perpendicular to length.

The term "metal," with respect to elements within the Periodic Table of the Elements, is intended to mean an element that is within any of the Groups 1 to 12 and, within Groups 13 to 16, an element that is along and below a line defined by atomic numbers 13 (Al), 31 (Ga), 50 (Sn), 51 (Sb), and 84 (Po). A metal element does not include Si or Ge.

Group numbers correspond to columns within the Periodic Table of Elements based on the IUPAC Periodic Table of Elements, version dated Dec. 1, 2018.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Embodiments as described herein can form a transistor having a gate electrode self-aligned to a gate metallization portion of a gate structure. In at least some embodiments, the transistor can be an enhancement-mode high electron mobility transistor (HEMT) having III-N gate electrode, such as p-type doped GaN gate electrode, self-aligned to the gate metallization portion. The gate metallization portion can be directly deposited onto a gate electrode layer surface after the gate electrode layer is epitaxially grown and before the gate electrode layer is patterned to form the gate electrode. The gate metallization portion can include a gate metallization stack that is atomically aligned to the crystal plane along the surface of the gate electrode layer. The self-alignment of the gate electrode may be achieved by using conductive sidewall spacers that can also be atomically aligned to the crystal plane of the gate electrode layer. The conductive sidewall spacers can prevent or substantially reduce the likelihood that a metal within the gate metallization stack will react with a material within an ILD layer during a subsequent anneal. The materials for the gate metallization stack and the conductive sidewall spacers can be chosen separately to provide a good balance between threshold voltage (Vth) and gate current ($I_G$) for a HEMT when the HEMT is in an on-state. The thickness of a bulk conductive film of the gate metallization stack can be selected so that the principal metal of the gate metallization stack (e.g., Al, Cu, or the like) constitutes the main conducting material, even when some of the principal metal reacts to form an intermetallic compound.

In an aspect, an electronic device can include a gate structure. The gate structure can include a gate electrode including a doped semiconductor material; a first metal-containing member overlying the gate electrode, wherein first the metal-containing member has a first side and a second side opposite the first side; a first conductive sidewall spacer overlying the gate electrode and adjacent to the first side of the first metal-containing member; and a second conductive sidewall spacer overlying the gate electrode and adjacent to the second side of the first metal-containing member.

In another aspect, an electronic device can include a HEMT. The HEMT can include a gate structure that includes a gate electrode including a doped semiconductor material; a first metal-containing member overlying the gate electrode; and a second metal-containing member overlying the first metal-containing member. The gate electrode can have a first length, the second metal-containing member can have a second length, and the first metal-containing member can have a third length that is greater than the first length and substantially the same as the second length.

In a further aspect, a process of forming an electronic device can comprise forming a gate electrode layer over a barrier layer; forming a first metal-containing layer over the gate electrode layer; patterning to the first metal-containing layer to form a first metal-containing member having a first side and a second side opposite the first surface; forming a second metal-containing layer over the first metal-containing member and along the first side surface and the second side surface of the first metal-containing member; removing a portion of the second metal-containing layer to form at least one second metal-containing member; and removing portions of the gate electrode layer to form a gate electrode. A gate structure for the transistor structure can include the gate electrode, the first metal-containing member, and the at least one second metal-containing member, and each of the gate electrode, the first metal-containing member, and the at least one second metal-containing member can be conductive.

FIG. 1 includes a cross-sectional view of a portion of a workpiece 100 that includes a base material 122, a buffer layer 124, a channel layer 126, a barrier layer 128, and a gate electrode layer 134. The base material 122 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers. In an embodiment, the base material 122 can be in the form of a wafer. An optional nucleation layer (not illustrated) may be formed over the base material 122 before forming the buffer layer 124.

The buffer layer 124 can include a III-N material, and in a particular embodiment, can include $Al_aGa_{(1-a)}N$, where $0 \leq a \leq 1$. The composition of the buffer layer 124 may depend on the composition of the semiconductor base material of the channel layer 126 and the designed operating voltage of the HEMT. The composition of the buffer layer 124 can be changed as a function of thickness, such that the buffer layer 124 has a relatively greater aluminum content closer to the base material 122 and relatively greater gallium content closer to the channel layer 126. In a particular embodiment, the cation (metal atoms) content in the semiconductor base material of the buffer layer 124 near the base material 122 can be 10 atomic % to 100 atomic % Al with the remainder Ga, and the cation content in the semiconductor base material of the buffer layer 124 near the channel layer 126 can be 0 atomic % to 50 atomic % Al with the remainder Ga. In another embodiment, the buffer layer 124 can include a plurality of films. The buffer layer 124 can have a thickness in a range from 1 micron to 9 microns. If needed or desired, the buffer layer 124 can be doped with a p-type dopant element such as carbon or iron.

The channel layer 126 is formed over the buffer layer 124 and has a major surface 127. The channel layer 126 can include $Al_zGa_{(1-z)}N$, where $0 \leq z \leq 0.1$. In a particular embodiment, the channel layer 126 is a GaN layer (z=0). The channel layer 126 may be undoped or unintentionally doped or doped with an electron donor (n-type) dopant or an electron acceptor (p-type) dopant. In an embodiment, the concentration of p-type dopant or n-type dopant may be kept as low as reasonably possible.

In a particular embodiment, p-type dopant can include carbon from a source gas (e.g., $Ga(CH_3)_3$) when metalorganic chemical vapor deposition (MOCVD) is used to form the channel layer 126. In a particular embodiment, the lowest trap concentration is desired but may be limited by growth or deposition conditions and purity of the precursors. Thus, some carbon can become incorporated as the channel layer 126 is grown, and such carbon can result in unintentional doping. In an embodiment, the channel layer 126 has a carrier impurity concentration that is greater than 0 atoms/$cm^3$ and at most $5 \times 10^{16}$ atoms/$cm^3$. In a particular embodiment, the carrier impurity concentration is in a range from $1 \times 10^{15}$ atoms/$cm^3$ to $1 \times 10^{16}$ atoms/$cm^3$.

In an embodiment, the channel layer 126 has a thickness that is at least 50 nm. When the thickness is less than 50 nm, a two-dimensional electron gas (2DEG) may be more difficult to generate, maintain, or both. In the same or another embodiment, the channel layer 126 has a thickness that is at most 5000 nm. In a particular embodiment, the thickness in a range from 50 nm to 300 nm can provide sufficiently thick channel layer 126 to allow for the proper generation and maintaining of the 2DEG and still obtain a reasonable value for on-state resistance (RDSON).

The barrier layer 128 can include a III-V semiconductor base material, such as a III-N semiconductor base material. The barrier layer 128 can include one or more films, where each of the films can include $Al_cIn_dGa_{(1-c-d)}N$, wherein $0.0 < c \leq 0.5$ and $0.0 \leq d \leq 0.2$. In an embodiment, the one or more films can include $Al_yGa_{(1-y)}N$, wherein $0.02 \leq y \leq 0.5$. In an embodiment, within the barrier layer, a film closer to the channel layer 126 can have a higher Al content and be thinner as compared to a film farther from the channel layer 126. In the any of the foregoing embodiments, the barrier layer 128 can be undoped or unintentionally doped. Thus, the barrier layer 128 may have any of the carrier impurity concentrations as previously described with respect to the channel layer 126. The barrier layer 128, and any film within the barrier layer 128, may have a carrier impurity concentration that is the same or different as compared to the channel layer 126. The thickness of the barrier layer 128 can be in a range from 8 nm to at most 30 nm.

The buffer layer 124, the channel layer 126, and barrier layer 128 can be formed using an epitaxial growth technique, and thus, the barrier layer 128, the channel layer 126, and at least a portion of the buffer layer 124 can be monocrystalline. In a particular embodiment, metal-containing films can be formed using metalorganic chemical vapor deposition.

A gate electrode layer 134 of the HEMT can be a doped semiconductor, and in an embodiment, include a p-type semiconductor material. In a particular embodiment, the gate electrode layer 134 can include $Al_xGa_{(1-x)}N$, wherein $0 \leq x \leq 0.1$. In an embodiment, the gate electrode layer 134 is a p-type doped GaN layer. The p-type dopant in the gate electrode layer 134 can include Mg, C, or the like. In an embodiment, the dopant concentration in the gate electrode layer 134 can be in a range from $1 \times 10^{18}$ atoms/$cm^3$ to $1 \times 10^{21}$ atoms/$cm^3$. The gate electrode layer 134 can have a thickness in a range from 1 nm to 100 nm.

In a conventional process, the gate electrode layer 134 would be patterned to form a gate electrode, an interlevel dielectric (ILD) layer would be formed over the gate electrode and patterned to define a contact opening to the gate electrode, and contact metallization would have extended into the contact opening and contact the gate electrode. Such a process may result in one or more problems. The contact etch used to form the contact opening may cause the upper surface of the gate electrode layer 134 to become roughened. The rougher surface can lead to higher contact resistance and higher leakage current. Further, aligning the contact mask to the gate electrode layer 134 may be difficult due to the relatively thin gate electrode layer 134, which may be substantially transparent and make alignment marks corresponding to the gate electrode layer 134 difficult to detect by a lithographic tool. As the misalignment between the contact opening and the gate electrode layer 134 increases, parasitic gate leakage current can increase, and in extreme cases, the contact metallization may extend over the edge of the gate electrode and contact the barrier layer 128 and result in an electrical short.

Unlike a conventional process, gate metallization can be formed over the gate electrode layer 134 before the gate electrode layer 134 is patterned to form the gate electrode. The gate structure formed using a process described herein can allow the gate metallization to contact a relatively smooth surface of the gate electrode layer 134 to help reduce contact resistance and gate leakage current. In an embodiment, crystal orientations of gate electrode layer 134 and layers formed over the gate electrode layer 134 can help to further reduce contact resistance associated with the gate electrode. In the same or different embodiment, conductive sidewall spacers may be formed to help reduce parasitic gate leakage current along a side of the gate electrode.

For a 0.6 micron×0.6 micron area, the gate electrode layer 134 can have a root mean square roughness (Rq) of at most 3.5 nm, at most 2.0 nm, or at most 0.9 nm; a maximum surface roughness (Rmax) of at most 24 nm, at most 20 nm, or at most 12 nm; or both the Rq and Rmax with the values as described. In an embodiment, Rq can be in a range from 0.10 nm to 2.0 nm, 0.15 nm to 1.5 nm, or 0.15 nm to 1.2 nm, and in the same or different embodiment, Rmax can be in a range from 1.5 nm to 10 nm, 2.0 nm to 9 nm, or 2.0 nm to 8 nm.

Figure 2:
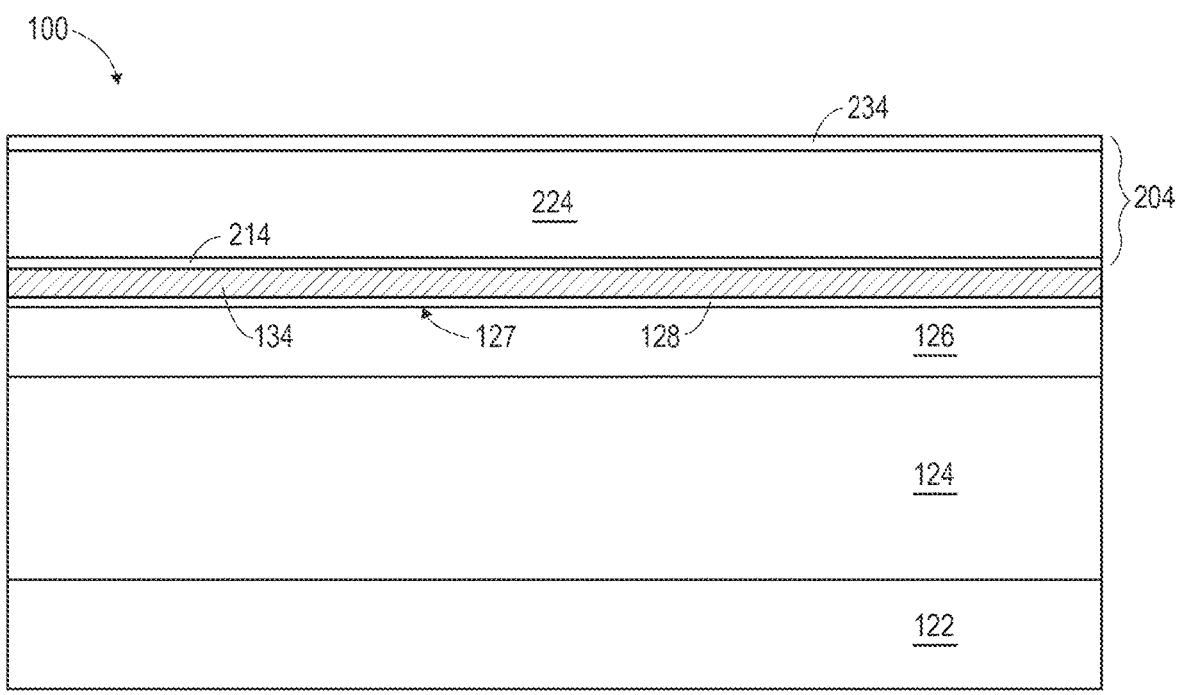
FIG. 2 includes an illustration of a cross-sectional view of the workpiece of FIG. 1 after forming a gate metallization stack.

A gate metallization stack 204 can be formed over the gate electrode layer 134, as illustrated in FIG. 2. The gate metallization stack 204 can include a lower film 214, a bulk conductive film 224, and an upper film 234. The lower film 214 can be an adhesion or barrier film. The lower film 214 can include a metal-containing layer, such Ti, TiN, Ta, TaN, W, WN or another similar metal, or an alloy of any of the foregoing metals. In an embodiment, the crystal orientation of the lower 214 can be selected to have a relatively low lattice mismatch to the upper surface of the gate electrode layer 134. More information regarding crystal planes and metallization can be found in U.S. Pat. No. 10,741,494, which is incorporated by reference herein in its entirety.

In a particular embodiment, the gate electrode layer 134 can include GaN, and its upper surface may lie along a (002) crystal plane. The lower film 214 can include TiN and have at least 80% of the area of each of its lower and upper surfaces along (111) crystal planes or can include Ti and have at least 80% of the area each of its lower and upper surfaces along (001) crystal planes. When the lower film 214 includes too much of its lower or upper surface along other crystal planes, contact resistance may increase. For example, the lower film 214 can include TiN and have too much of its surfaces along a (002) crystal plane, which corresponds to a rougher surface for the lower film 214.

Figure 3:
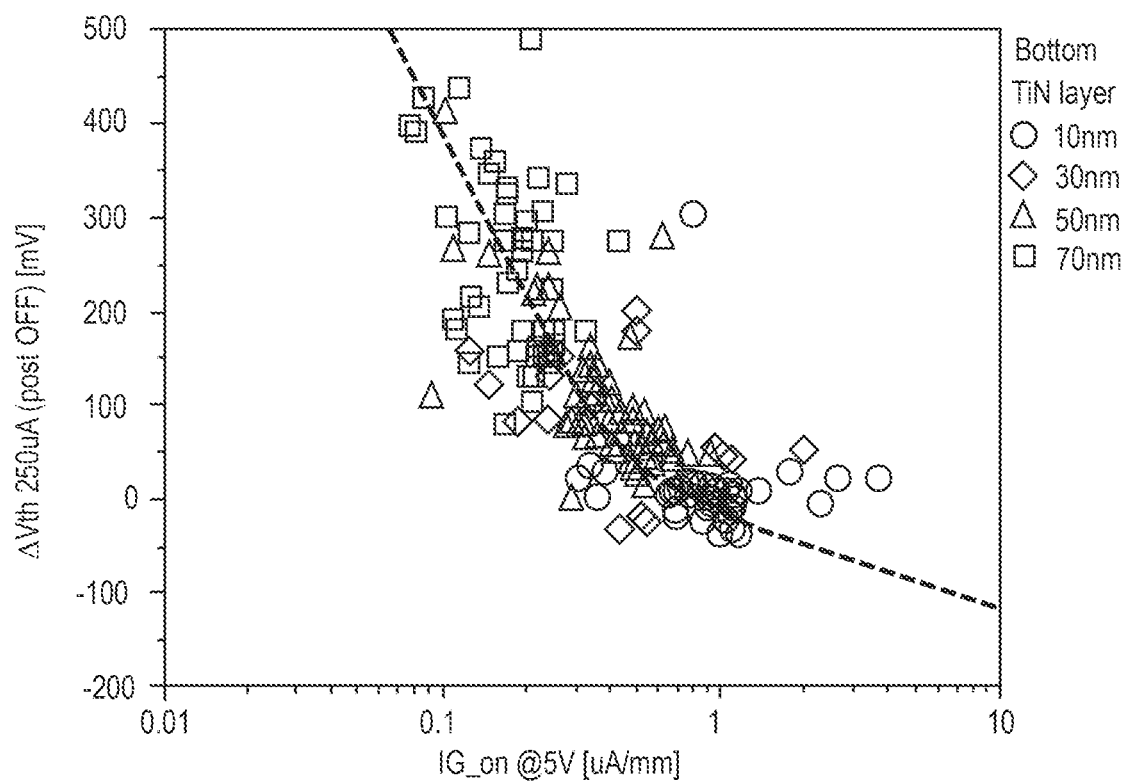
FIG. 3 includes a scatter plot of change in threshold voltage as a function of gate current for different thicknesses of a lower film within the gate metallization stack.

The thickness of the lower film 214 can affect the change in threshold voltage ($\Delta Vth$) and on-state $I_G$, as compared to an Al—Cu (1 wt % Cu) film directly contacts the gate electrode layer 134. The Schottky barrier height, $\Phi_0$, increases as the thickness of the lower barrier film 214 becomes thick. For TiN, at 10 nm, $\Phi_0$ is approximately 2.2 eV, and at a thickness in a range from 70 nm to 100 nm, $\Phi_0$ is approximately 2.35 eV. The thicker film allows for a relatively more positive $\Delta Vth$ and a relatively lower gate current, and a thinner film allows for a relatively more negative $\Delta Vth$ and a relatively higher gate current. FIG. 3 includes a scatter plot of different thicknesses of a TiN film to illustrate how changes $\Delta Vth$ as a function of gate current, which generally correspond to the dashed line illustrated in FIG. 3. Table 1 below includes compositions and thicknesses for the lower, bulk conductive, and upper films 214, 224, and 234 of the gate metallization stack 204. Excluding trace impurities, AlCu corresponds to 1 wt % copper with the remainder Al.

TABLE 1

Gate Metallization Stack Compositions

| | Lower film 214 | Bulk conductive film 224 | Upper film 234 |
|---|---|---|---|
| Stack 1 | 10 nm TiN | 250 nm AlCu | 30 nm TiN |
| Stack 2 | 30 nm TiN | 250 nm AlCu | 30 nm TiN |
| Stack 3 | 50 nm TiN | 250 nm AlCu | 30 nm TiN |
| Stack 4 | 70 nm TiN | 250 nm AlCu | 30 nm TiN |

Thus, after considering the data in Table 1 and FIG. 3, skilled artisans may select a thickness of the lower film 214 to achieve a desired combination of $\Delta Vth$ and on-state $I_G$.

As the lower film 214 becomes thicker, the film can have a more pronounced columnar structure as compared to a thinner film. Material from the bulk conductive film 224 may migrate between grains and become closer to the gate electrode layer. Thus, the lower film 214 may have a thickness less than 100 nm to allow for good device performance. In an embodiment, the thickness of the lower film 214 can be in a range of 5 nm to 99 nm.

The description above is based on data for the lower film based on TiN; however, other materials, such as Ti, are expected to have properties and characteristics similar to TiN. The particular thicknesses for such other materials may be the same or different for similar results with TiN as seen in FIG. 3.

The bulk conductive film 224 is responsible for providing low resistivity within the gate metallization stack 204. In another embodiment, the gate metallization stack is typically at least 70 wt % of aluminum, copper, or a noble metal. In an embodiment, the bulk conductive film 224 can include at least 90 wt % Al or Cu, as such materials are commonly used in Si-based devices. Similar to the lower film 214, crystal orientation of the bulk conductive film 224 can help to keep contact resistance relatively low. In a particular embodiment, the bulk conductive film 224 can have its lower surface aligned to the upper surface of the lower film 214, so that lattice mismatch is kept relatively low. When the gate electrode layer 134 includes GaN having a tetragonal lattice structure and an upper surface along a (002) crystal plane, the bulk conductive film 224 can include Al having a face centered cubic lattice structure. The bulk conductive film 224 can have its lower surface along a (111) crystal plane. In a particular embodiment, when the lower film 214 includes TiN having a cubic lattice structure and its surfaces along (111) crystal planes or Ti having a hexagonal lattice structure ($\alpha$-Ti) with its surfaces along (002) crystal plane, the combination of the gate electrode layer 134, the lower film 214, and the bulk conductive film 224 can have very good contact resistance. After reading this specification, skilled artisans will be able to select materials and crystal orientations for the gate electrode layer 134, the lower film 214, and the bulk conductive film 224 to have relatively low lattice mismatch between immediately adjacent layers or films and good contact resistance. Thus, the invention is not limited to only the materials and crystal orientations previously described.

The bulk conductive film 224 can have a thickness that is in a range from 50% to 95% of the total thickness of the gate metallization stack 204. In an embodiment, the thickness of the bulk conductive film 224 can be in a range from 0.05 micron to 4.0 micron.

The upper film 234 can be an antireflective or barrier film over the bulk conductive film 224. Thus, the upper film 234 can aid in reducing reflections during patterning of a subsequently-formed resist layer. The upper film 234 is a metal-containing layer and can include a metal nitride. In an embodiment, the upper film 234 can include any of the metal nitrides as previously described with respect to the lower film 214. The thickness of the upper film 234 can depend on the material and wavelength of radiation used to expose a resist layer. The thickness can be selected such that radiation when exposing a resist layer is sufficiently attenuated before reaching the bulk conductive film 224 where the bulk conductive film 224 can be highly reflective as compared to other materials within the electronic device. In an embodiment, the thickness of the upper film 234 has a thickness in a range from 5 nm to 500 nm. Other thicknesses may be used without deviated from the concepts as described herein.

Figure 4:
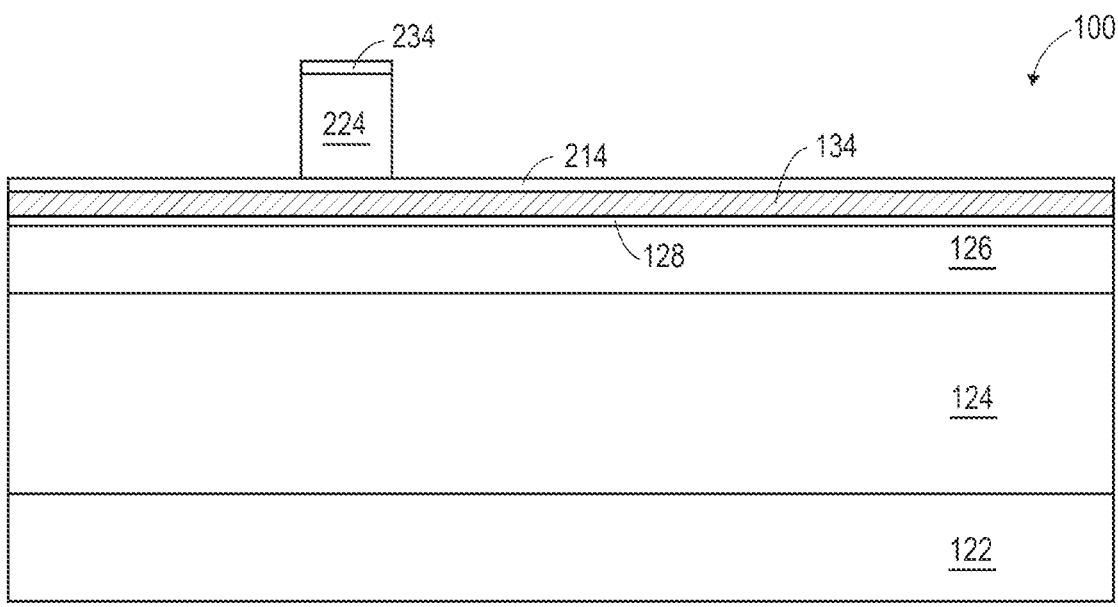
FIG. 4 includes an illustration of a cross-sectional view of the workpiece of FIG. 2 after patterning the gate metallization stack.

The bulk conductive film 224 and upper film 234 can be patterned as illustrated in FIG. 4. After forming a patterned resist layer (not illustrated), an etch can be performed using a chlorine chemistry. The etch gas can include $BCl_3$, $Cl_2$, another suitable chlorine-containing gas, or a combination thereof. The etch can end on the lower film 214, as illustrated in FIG. 4, or the gate electrode layer 134. The etch can be performed as a timed etch or using endpoint detection with or without a timed overetch.

Figure 5:
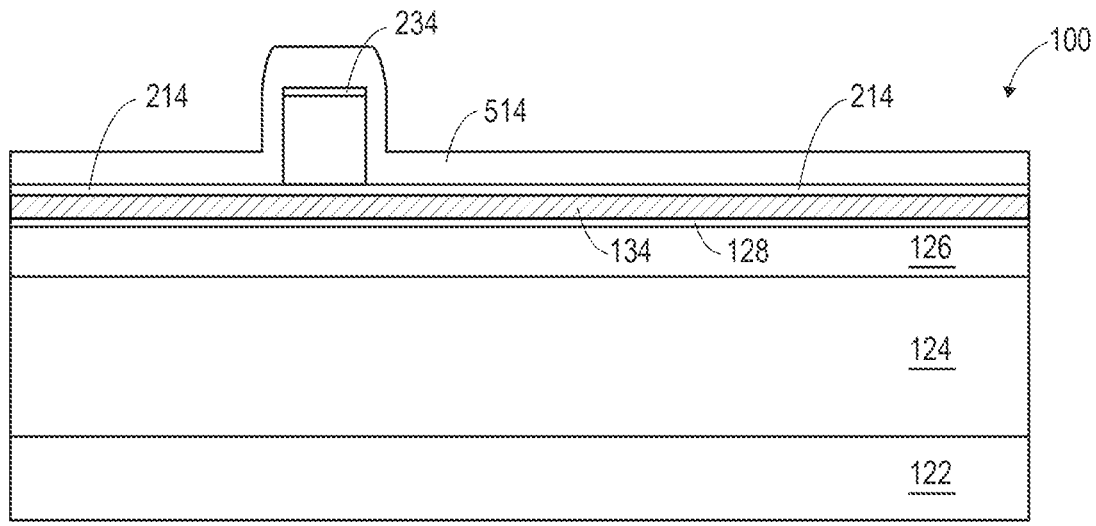
FIG. 5 includes an illustration of a cross-sectional view of the workpiece of FIG. 4 after depositing a metal-containing layer over the patterned gate metallization stack.

A metal-containing layer 514 is formed over the workpiece 100, as illustrated in FIG. 5. The metal-containing layer 514 can include a conductive material. In an embodiment, the metal-containing layer 514 can include any of the materials as previously described with respect to the lower film 214. In a particular embodiment, the metal-containing layer 514 can include any of the metal nitrides as described with respect to the lower film 214. The metal-containing layer 514 can include the same or a different material as compared to either or both of the films 214 and 234. The thickness of the metal-containing layer 514 can be selected to achieve a desired length along the bottom of subsequently formed conductive sidewall spacers. The thickness of the metal-containing layer 514 can be in a range from 100 nm to 700 nm.

Figure 6:
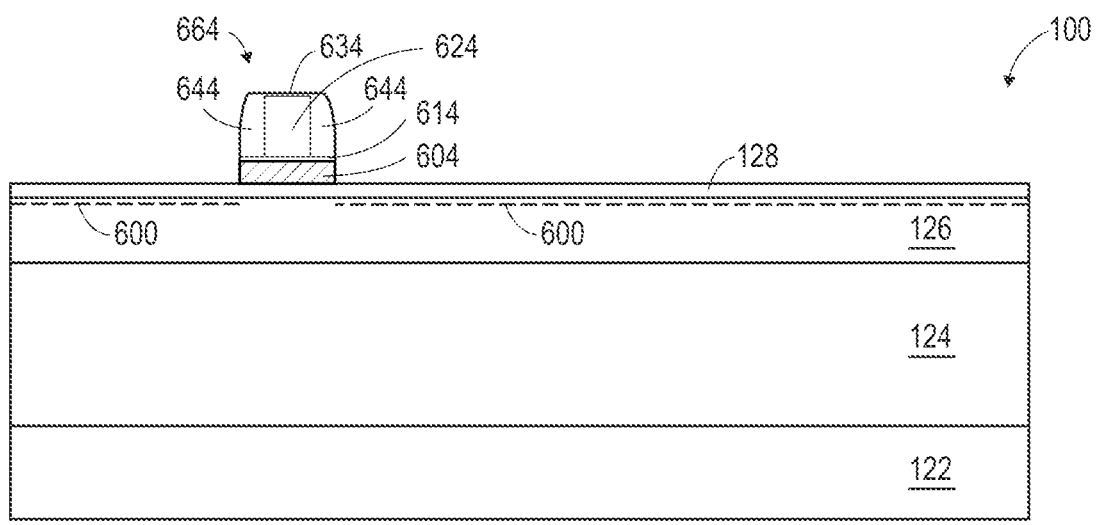
FIG. 6 includes an illustration of a cross-sectional view of the workpiece of FIG. 5 after completing formation of a gate structure in accordance with an embodiment.

The workpiece 100 can be etched to form a gate structure 664 that includes a gate electrode 604, a lower member 614, a bulk conductive member 624, an upper member 634, and conductive sidewall spacers 644, as illustrated in FIG. 6. Referring to FIGS. 5 and 6, the conductive sidewall spacers 644 are formed from the metal-containing layer 514, the gate electrode 604 is formed from the gate electrode layer 134, and the lower, bulk conductive and upper members 614, 624, and 634 are formed from corresponding films of the gate metallization stack 204.

The etch can be performed as an anisotropic etch. One or more portions of the etch can be performed to etch through the metal-containing layer 514, the lower film 214, and stop before etching through all of the gate electrode layer 134. The first portion of the etch process etches through the metal-containing layer 514 to form the conductive sidewall spacers 644 and may or may not etch through the lower film 214 to form the lower member 614.

Depending on the materials, the first portion can be performed as using one or more fluorine-containing gas, one or more chlorine-containing gas, or a combination of fluorine-containing and chlorine-containing gases. The chlorine-containing gas can include any of the chlorine-containing gases used in etching the bulk conductive film 224 as previously described. The fluorine-containing gas can include $SF_6$, $CF_4$, or the like. The fluorine-containing gas allows for better selectivity between materials of the metal-containing layer 514 and the gate electrode layer 134. The chlorine-containing gas has substantially no selectivity between materials of the metal-containing layer 514 and the gate electrode layer 134. When the gate electrode layer 134 is exposed, the chlorine-containing gas may be turned on or its relative amount in the etch gases may be increased. This etch sequence may allow for better control during the etch process, as the metal-containing layer 514 and lower film 214 may be etched using an etch gas composition before using a different gas composition when etching the gate electrode layer 134.

In another embodiment, the metal-containing layer 514, the lower film 214, and the gate electrode layer 134 may be etched using the same etch gas composition. The etch gas composition may include any of the chlorine-containing gas compositions previously described when etching the bulk conductive film 224. This process simplifies the etch sequence.

A last portion of the etch sequence can include a combination of fluorine-containing and chlorine-containing gases. The last portion of the etch sequence can start when etching the gate electrode layer 134 begins (based on detection of material from the gate electrode layer 134), is partly completed (the barrier layer 128 is not exposed), or using endpoint detection based on detecting the barrier layer 128. The fluorine in the etch gas can react with Al in the barrier layer 128 to form $AlF_3$ and help improve etch selectivity to material in the barrier layer 128 as compared to materials that overlie the barrier layer 128 at the beginning of the etch sequence (see FIG. 5). During this portion of the etch, the atomic ratio of F:Cl can be in a range from 0.22 to 1.11. After reading this specification, skilled artisans will appreciate that other ratios may be used without deviating from the concepts as disclosed herein.

At this point in the process, the gate structure 664 is formed. A 2DEG 600 is formed along the heterojunction between the channel and barrier layers 126 and 128 at regions not covered by the gate structure 664. Using the process, the gate electrode 604 can be self-aligned to the combination of the bulk conductive member 624 and the conductive sidewall spacers 644. Thus, the bulk conductive member 624 is centered over the gate electrode 604 and does not have any portion that contacts the barrier layer 128. Therefore, an electrical short between the bulk conductive member 624 and the barrier layer 128 is obviated. Further, the conductive sidewall spacers 644 can help to prevent or at least reduce parasitic sidewall gate leakage current.

Referring to FIG. 6, the gate length for the HEMT structure illustrated corresponds to the length of the gate electrode 604. The lower member 614 has substantially the same length as the gate electrode 604 or a length that is within 10% of the length of the gate electrode 604. A combination of the lengths of the conductive sidewall spacers 644 (as measured along the bottom surfaces of the conductive sidewall spacers 644) and the bulk conductive member 624 can be within 10% of one or both of the lengths of the gate electrode 604 and the lower member 614. The length of the bulk conductive member 624 is substantially greater than both of the lengths of the conductive sidewall spacers 644, and therefore, the conductive sidewall spacers 644 have an insignificant effect on Vth shift for the transistor structure.

In a particular embodiment, the lower member 614, the conductive sidewall spacers 644, and the upper member 634 can include one or more metal nitride materials. Such a configuration may surround the bulk conductive member 624 and allow material within the bulk conductive member 624 to be encapsulated to prevent or substantially reduce the likelihood that material within the bulk conductive member 624 can migrate to other parts of the electronic device. Thus, Cu and other materials may be used for the bulk conductive member 624. Some of the process flow may need to be modified to allow Cu and other materials to be used (e.g., using an inlaid process sequence to define the shape of the bulk conductive member 624).

Figure 7:
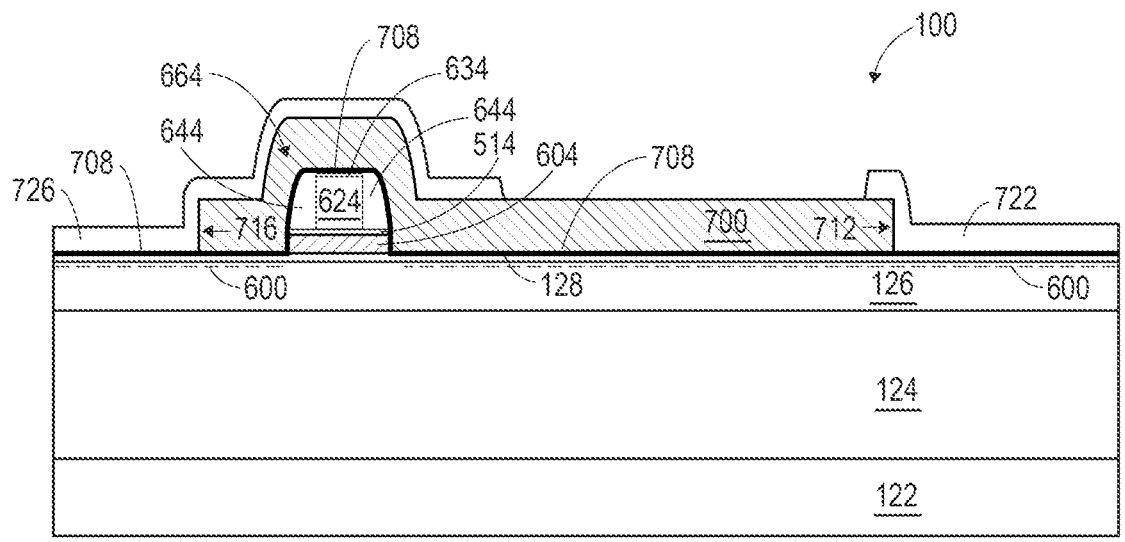
FIG. 7 includes an illustration of a cross-sectional view of the workpiece of FIG. 6 after forming a substantially completed electronic device.

FIG. 7 includes an illustration of a substantially completed electronic device. A passivation layer 708, an interlevel dielectric (ILD) layer 700 is formed over the workpiece 100 including the barrier layer 128 and the gate structure 664. The passivation layer 708 helps to reduce dangling bonds that may lie along the exposed portions of the barrier layer 128. The passivation layer 708 can include $Si_3N_4$, $Al_2O_3$, $HfO_2$, or the like. The thickness of the passivation layer 708 is sufficient to cover the barrier layer 128. Although the passivation layer 708 may be very thick, for practical reasons, it may be kept relatively thin as compared to other layers within the electronic device. In an embodiment, the thickness can be in a range from 2 nm to 50 nm. In the same or different embodiment, the passivation layer 708 can be formed using atomic layer deposition. In other embodiments, the thickness may be outside the previously described range or another deposition technique may be used.

The ILD layer 700 can include a single film or a plurality of films. The single film or each of the films can include an oxide, a nitride, or an oxynitride. In an embodiment, the ILD layer 700 can have a thickness in a range from 20 nm to 2000 nm. The ILD layer 700 can be patterned to define a drain contact opening 712, a source contact opening 716, and a gate interconnect opening (not illustrated).

A conductive layer is formed over the ILD layer 700 and within the contact openings 712 and 716 and the gate interconnect opening. The conductive layer can have any of the films, compositions of the films, and any of the thicknesses of the films as previously described with respect to the gate metallization stack 204. The conductive layer for the drain electrode 722, source electrode 726, and gate interconnect may have more or fewer film as compared to the gate metallization stack 204. The conductive layer for the electrodes 722 and 726 and gate interconnect can include a lower film, a bulk conductive film, and an upper film, where such films have any composition as previously described with respect to the lower film 214, a bulk conductive film 224, and the upper film 234, respectively. The conductive layer for the electrodes 722 and 726 and the gate interconnect can have the same or a different composition as compared to the gate metallization stack 204 and the same or a different thickness as compared to the gate metallization stack 204.

In an embodiment, the barrier layer 128 includes $Al_zGa_{(1-y)}N$, wherein $0.02 \leq y \leq 0.5$ and has hexagonal lattice structure. The barrier layer 128 can have a surface along a (002) crystal plane. The lower film of the conductive layer can include TiN having its upper and lower surfaces along (111) crystal planes or Ti having its upper and lower surfaces along (002) crystal planes. The bulk conductive film can include Al with its lower surface in contact with the lower film, wherein most or all of the lower surface is along a (111) crystal plane. The bulk conductive film can include Al crystals having a (111) crystal orientation and other Al crystals having a (200) crystal orientation. Referring to the gate metallization stack 204, the bulk conductive layer 224 can include Al, where up to 100% of the Al crystals have a (111) crystal orientation along the surface of the lower film 214.

Unlike the gate metallization stack 204 that contacts the p-doped GaN gate electrode 604, the conductive layer for the drain and source electrodes 722 and 726 contacts the barrier layer 128 that can include a significant amount of another Group 13 element, such as Al, In, or both. Thus, the bulk conductive film for the drain and source electrodes 722 and 726 can have more strain as compared to the bulk conductive film 224. In an embodiment, the bulk conductive film for the drain and source electrodes 722 and 726 can include Al where less than 100% of the Al crystals having a (111) crystal orientation. For all Al crystals in the bulk conductive film, at least 80%, at least 91%, or at least 95% can have a (111) crystal orientation, and at most 20%, at most 9%, or at most 5% can have a (200) crystal orientation. The Al crystals with a (200) crystal orientation can help to reduce strain within the bulk conductive film. After reading this specification, skilled artisans will be able to select materials and corresponding crystal orientations for the lower film and conductive bulk conductive film to achieve good contact resistance and sufficiently low strain within the conductive bulk conductive film.

The conductive layer is patterned to form the drain electrode 722, the source electrode 726, and the gate interconnect. The portion of the drain electrode 722 that extends over the ILD layer 700 toward the gate structure 664, and the portion of the source electrode 726 that extends over the ILD layer 700 and the gate structure 664 toward the drain electrode 722 are field electrodes that help to control electrical fields withing the HEMT structure. The gate interconnect contacts the gate structure 664 at a location not illustrated in FIG. 7. The gate interconnect can be electrically connected to other gate structures for other transistor structures. In an embodiment, the gate interconnect may include a gate runner and at least one gate bond pad.

The drain electrode 722, the source electrode 726, and the gate interconnect may be formed at the same or different interconnect levels. In a particular embodiment, the drain and source electrodes 722 and 726 can be formed at the same interconnect level, and the gate interconnect may be formed at a different interconnect level. After reading this specification, skilled artisans will be able to determine a process flow that meets the needs or desires for a particular application.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. After forming the interconnect levels and the passivation layer, an anneal may be performed. Performance of the previously described anneal may be deferred until this time, or an anneal separate from the anneal previously described may be performed. If a separate anneal is performed, it may be performed using the same or different parameters as the anneal previously described. A substantially completed electronic device has been formed.

Figure 8:
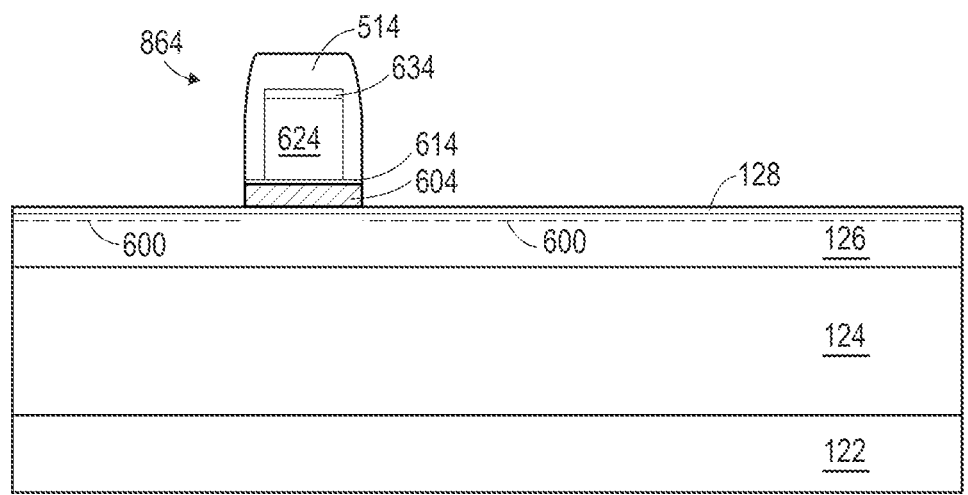
FIG. 8 includes an illustration of a cross-sectional view of the workpiece of FIG. 5 after completing formation of a gate structure in accordance with another embodiment.

In another embodiment, a different shape of a gate structure may be used. The process up to and including formation of the metal-containing layer 514 in FIG. 5 is performed. A resist member (not illustrated) is formed over a portion of the workpiece and corresponds to the shape of the desired gate structure. The exposed portions of the metal-containing layer 514 and the gate electrode layer 134 are removed to define the gate structure 864 in FIG. 8. The etch sequence previously described with respect to the gate structure 664 in FIG. 6 can be performed. The gate structures 664 and 864 are similar except for the metal-containing layer 514 has substantially its full thickness over metallized portion of the gate structure 864. The processing following formation of the gate structure 664 in FIG. 6 can be performed to achieve a substantially completed electronic device similar to HEMT structure in FIG. 7 except that the gate structure 664 in FIG. 7 is replaced by the gate structure 864.

Embodiments as described herein can form a transistor having a gate electrode self-aligned to a gate metallization portion, such as a gate metallization stack, of a gate structure. In at least some embodiments, the transistor can be an enhancement-mode high electron mobility transistor (HEMT) having III-N gate electrode, such as p-type doped GaN gate electrode, self-aligned to the gate metallization portion. The gate metallization can be directly deposited onto the gate electrode surface after the gate electrode layer is epitaxially grown and before the gate electrode layer is patterned. The gate metallization stack can be atomically aligned to the crystal plane along the surface of the gate electrode layer. The self-alignment of the gate electrode may be achieved by using conductive sidewall spacers that can also be atomically aligned to the crystal plane of the gate electrode layer. The conductive sidewall spacers can prevent or substantially reduce the likelihood that a material within the gate metallization stack will react with a material within an ILD layer during a subsequent anneal. The materials for the gate metallization stack and the conductive sidewall spacers can be chosen separately to provide a good balance between Vth and on-state $I_G$ for a HEMT. The thickness of a bulk conductive film of the gate metallization stack can be selected so that the principal metal of the gate metallization stack (e.g., Al, Cu, or the like) constitutes the main conducting material, even when some of the principal metal reacts to form an intermetallic compound.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a gate structure. The gate structure can include a gate electrode including a doped semiconductor material; a first metal-containing member overlying the gate electrode, wherein first the metal-containing member has a first side and a second side opposite the first side; a first conductive sidewall spacer overlying the gate electrode and adjacent to the first side of the first metal-containing member; and a second conductive sidewall spacer overlying the gate electrode and adjacent to the second side of the first metal-containing member.

Embodiment 2. The electronic device of Embodiment 1, wherein at least 90% of an area of an upper surface of the gate electrode is covered by a combination of the first metal-containing member, the first conductive sidewall spacer, and the second conductive sidewall spacer.

Embodiment 3. The electronic device of Embodiment 1 further includes a gate interconnect, wherein the gate interconnect contacts the gate structure.

Embodiment 4. The electronic device of Embodiment 1 further includes a second metal-containing member disposed between the gate electrode and the first metal-containing member.

Embodiment 5. The electronic device of Embodiment 4 further includes a third metal-containing member containing and covering an upper surface of the first metal-containing member.

Embodiment 6. The electronic device of Embodiment 5, wherein the first conductive member includes a first metal nitride material, the second conductive member includes a second metal nitride material, the second metal-containing member includes third metal nitride material, and the third metal-containing member includes a fourth metal nitride material.

Embodiment 7. The electronic device of Embodiment 4 further includes a channel layer; a barrier layer disposed between the channel layer and the gate electrode; a drain electrode overlying the channel layer and contacting the barrier layer; and a source electrode overlying the channel layer and contacting the barrier layer. The gate electrode can include p-type doped GaN, the first metal-containing layer can include at least 90 wt. % Al or at least 90 wt. % Cu, the second-metal containing layer can include TiN or at least 90 wt. % Ti, and the first conductive sidewall spacer and the second conductive sidewall spacer can include TiN.

Embodiment 8. An electronic device can include a high electron mobility transistor, including a gate structure. The gate structure can include a gate electrode including a doped semiconductor material; a first metal-containing member overlying the gate electrode; and a second metal-containing member overlying the first metal-containing member. The gate electrode can have a first length, the second metal-containing member can have a second length, and the first metal-containing member can have a third length that is greater than the first length and substantially the same as the second length.

Embodiment 9. The electronic device of Embodiment 8, wherein, for a 0.6 micron×0.6 micron area, the gate electrode has an upper surface with an Rq of at most 2.0 nm or Rmax of at most 10 nm.

Embodiment 10. The electronic device of Embodiment 8, wherein the first metal-containing member has a thickness in a range from 5 nm to 99 nm.

Embodiment 11. The electronic device of Embodiment 8, wherein the gate structure further includes a third metal-containing member and covering an upper surface of the second metal-containing member.

Embodiment 12. The electronic device of Embodiment 8 further includes a first conductive sidewall spacer and a second conductive sidewall spacer. The first conductive sidewall spacer can overlie the gate electrode and can lie along a first side of the second metal-containing member, and the second conductive sidewall spacer can overlie the gate electrode and can lie along a second side of the second metal-containing member, wherein the second side is opposite the first side.

Embodiment 13. The electronic device of Embodiment 8, wherein the gate electrode can include p-type doped GaN having a surface in contact with the first metal-containing member, wherein the surface is along a (002) crystal plane. The first metal-containing member can have a first surface in contact with the gate electrode and a second surface in contact with the second metal-containing member. The first metal-containing member can include TiN, wherein at least 80% of areas of each of the first and second surfaces is along a (111) crystal plane, or the first metal-containing member can include Ti, wherein at least 80% of areas of each of the first and second surfaces is along a (002) crystal plane. The second metal-containing member can include Al and at least 80% of an area of a surface in contact with the first metal-containing member is along a (111) crystal plane.

Embodiment 14. The electronic device of Embodiment 13, wherein the high electron mobility transistor further includes a channel layer; a barrier layer disposed between the channel layer and the gate electrode; a drain electrode overlying the channel layer and contacting the barrier layer; and a source electrode overlying the channel layer and contacting the barrier layer.

Embodiment 15. A process of forming an electronic device can include forming a gate electrode layer over a barrier layer; forming a first metal-containing layer over the gate electrode layer; patterning to the first metal-containing layer to form a first metal-containing member having a first side and a second side opposite the first surface; forming a second metal-containing layer over the first metal-containing member and along the first side surface and the second side surface of the first metal-containing member; removing a portion of the second metal-containing layer to form at least one second metal-containing member; and removing portions of the gate electrode layer to form a gate electrode. A gate structure for the transistor structure can include the gate electrode, the first metal-containing member, and the at least one second metal-containing member. Each of the gate electrode, the first metal-containing member, and the at least one second metal-containing member can be conductive.

Embodiment 16. The process of Embodiment 15, wherein removing the portion of the second metal-containing layer forms a first sidewall spacer along the first side of the first metal-containing member and a second sidewall spacer along the second side of the second metal-containing member.

Embodiment 17. The process of Embodiment 16 further includes forming a third metal-containing layer over the gate electrode layer and before forming the first metal-containing layer, wherein, for a 0.6 micron×0.6 micron area, the gate electrode layer has an exposed surface with an Rq of at most 2.0 nm or Rmax of at most 10 nm; and removing portions of the third metal-containing layer that are not covered by the first metal-containing member, the first sidewall spacer, or the second sidewall spacer to form a conductive metal-nitride member, wherein the gate structure further includes the third metal-containing member.

Embodiment 18. The process of Embodiment 17, wherein the third metal-containing layer includes (1) TiN and has a surface along a (111) crystal plane or (2) Ti and has a surface along a (002) crystal plane, and a surface of the third metal-containing layer is in contact a surface of the gate electrode layer that include p-type doped GaN, wherein the surface of the gate electrode layer is along a (002) crystal plane.

Embodiment 19. The process of Embodiment 15, further includes forming a passivation layer over the gate structure and an exposed portion of a barrier layer before forming a silicon dioxide film over the barrier layer.

Embodiment 20. The process of Embodiment 15, further includes a source electrode and a drain electrode, wherein the gate structure, the source electrode, and the drain electrode are parts of a high electron mobility transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a gate structure including:
   a gate electrode including a doped semiconductor material;
   a first metal-containing member overlying the gate electrode and including a first metal nitride material;
   a second metal-containing member overlying the first metal-containing member, wherein the second metal-containing member has a first side and a second side opposite the first side;
   a third metal-containing member covering an upper surface of the second metal-containing member, wherein the third metal-containing member includes a second metal nitride material;
   a first conductive sidewall spacer overlying the gate electrode and adjacent to the first side of the second metal-containing member, wherein the first conductive sidewall spacer includes a third metal nitride material; and
   a second conductive sidewall spacer overlying the gate electrode and adjacent to the second side of the second metal-containing member, wherein the second conductive sidewall spacer includes a fourth metal nitride material.

2. The electronic device of claim 1, wherein at least 90% of an area of an upper surface of the gate electrode is covered by a combination of the second metal-containing member, the first conductive sidewall spacer, and the second conductive sidewall spacer.

3. The electronic device of claim 1, further comprising a gate interconnect, wherein the gate interconnect contacts the gate structure.

4. The electronic device of claim 1, further comprising:
   a channel layer;
   a barrier layer disposed between the channel layer and the gate electrode;
   a drain electrode overlying the channel layer and contacting the barrier layer; and
   a source electrode overlying the channel layer and contacting the barrier layer,
   wherein:
   the gate electrode includes p-type doped GaN,
   the second metal-containing member includes at least 90 wt % Al or at least 90 wt % Cu,
   the first metal-containing member includes TiN, and
   each of the first conductive sidewall spacer and the second conductive sidewall spacer includes TiN.

5. The electronic device of claim 1, wherein:
   the first conductive sidewall spacer has a first arcuate surface, and
   the second conductive sidewall spacer has a second arcuate surface.

6. An electronic device comprising a high electron mobility transistor, wherein the high electron mobility transistor comprises:
   a gate structure that includes:
   a gate electrode including p-type doped GaN having a surface along a (002) crystal plane;
   a first metal-containing member overlying the gate electrode and having a thickness in a range from 5 nm to 99 nm; and
   a second metal-containing member overlying the rust metal-containing member,
   wherein:
   the first metal-containing member has a first surface in contact with the surface of the gate electrode and a second surface in contact with the second metal-containing member,
   the first metal-containing member includes:

TiN, wherein at least 80% of areas of each of the first and second surfaces is along a (111) crystal plane, or Ti, wherein at least 80% of areas of each of the first and second surfaces is along a (002) crystal plane, the second metal-containing member includes Al and at least 80% of an area of a surface in contact with the first metal-containing member is along a (111) crystal plane, the gate electrode has a first length, the second metal-containing member has a second length, and the first metal-containing member has a third length that is greater than the second length, and the third length is no more than 10% different from the length.

7. The electronic device of claim 6, wherein, for a 0.6 micron×0.6 micron area, the gate electrode has an upper surface with an Rq of at most 2.0 nm or Rmax of at most 10 nm.

8. The electronic device of claim 6, wherein the gate structure further comprises a third metal-containing member and covering an upper surface of the second metal-containing member.

9. The electronic device of claim 6, further comprising a first conductive sidewall spacer and a second conductive sidewall spacer, wherein:

the first conductive sidewall spacer overlies the gate electrode and lies along a first side of the second metal-containing member, and the second conductive sidewall spacer overlies the gate electrode and lies along a second side of the second metal-containing member, wherein the second side is opposite the first side.

10. The electronic device of claim 6, wherein the high electron mobility transistor further comprises:

a channel layer;

a barrier layer disposed between the channel layer and the gate electrode;

a drain electrode overlying the channel layer and contacting the barrier layer; and a source electrode overlying the channel layer and contacting the barrier layer.

11. The electronic device of claim 6, the gate structure further comprises:

a first sidewall spacer overlying the gate electrode and the first metal-containing member; and a second sidewall spacer overlying the gate electrode and the first metal-containing member, wherein the second metal-conducting member is disposed between the first sidewall spacer and the second sidewall spacer.

12. A process of forming an electronic device comprising:

forming a gate electrode layer over a barrier layer;

forming a first metal-containing layer over the gate electrode layer;

patterning to the first metal-containing layer to form a first metal-containing member having a first side and a second side opposite the first side;

forming a second metal-containing layer over the first metal-containing member and along the rust side and the second side of the first metal-containing member, removing a portion of the second metal-containing layer to form at least one second metal-containing member, and removing portions of the gate electrode layer to form a gate electrode, wherein:

a gate structure for a transistor structure includes the gate electrode, the first metal-containing member, and the at least one second metal-containing member, and each of the gate electrode, the first metal-containing member, and the at least one second metal-containing member is conductive.

13. The process of claim 12, wherein removing the portion of the second metal-containing layer forms a rust sidewall spacer along the first side of the first metal-containing member and a second sidewall spacer along the second side of the second metal-containing member.

14. The process of claim 13, further comprising:

forming a third metal-containing layer over the gate electrode layer and before forming the first metal-containing layer, wherein, for a 0.6 micron×0.6 micron area, the gate electrode layer has an exposed surface with an Rq of at most 2.0 nm or Rmax of at most 10 nm; and removing portions of the third metal-containing layer that are not covered by the first metal-containing member, the first sidewall spacer, or the second sidewall spacer to form a third metal-containing member, wherein the gate structure further includes the third metal-containing member.

15. The process of claim 14, wherein the third metal-containing layer includes (1) TiN and has a surface along a (111) crystal plane or (2) Ti and has a surface along a (002) crystal plane, and a surface of the third metal-containing layer is in contact a surface of the gate electrode layer that include p-type doped GaN, wherein the surface of the gate electrode layer is along a (002) crystal plane.

16. The process of claim 12, further comprising forming a passivation layer over the gate structure and an exposed portion of the barrier layer before forming a silicon dioxide film over the barrier layer.

17. The process of claim 12, further comprising a source electrode and a drain electrode, wherein the gate structure, the source electrode, and the drain electrode are parts of a high electron mobility transistor.

* * * * *

UNITED STATES PATENT AND TRADEMARK OFFICE
CERTIFICATE OF CORRECTION

PATENT NO. : 11,721,736 B2
APPLICATION NO. : 17/172243
DATED : August 8, 2023
INVENTOR(S) : Aurore Constant et al.

It is certified that error appears in the above-identified patent and that said Letters Patent is hereby corrected as shown below:

In the Claims

In Column 16, Line 60-61, please delete "the rust metal-containing", and insert --the first metal-containing--

In Column 17, Line 16-17, please delete "the length.", and insert --the first length.--

In Column 18, Line 7, please delete "the rust side", and insert --the first side--

In Column 18, Line 8, please delete "member,", and insert --member;--

In Column 18, Line 10-11, please delete "member, and", and insert --member; and--

In Column 18, Line 23-24, please delete "a rust sidewall", and insert --a first sidewall--

Signed and Sealed this
Ninth Day of April, 2024

Katherine Kelly Vidal
*Director of the United States Patent and Trademark Office*